United States Patent [19]

Muth

[11] Patent Number: 5,118,967
[45] Date of Patent: Jun. 2, 1992

[54] ADAPTIVE ARRANGEMENT FOR IDENTIFYING A PERIODIC SIGNAL

[75] Inventor: Mathias Muth, Stelle, Fed. Rep. of Germany

[73] Assignee: U.S. Philips Corporation, New York, N.Y.

[21] Appl. No.: 595,125

[22] Filed: Oct. 9, 1990

[30] Foreign Application Priority Data

Oct. 10, 1989 [DE] Fed. Rep. of Germany ....... 3933801

[51] Int. Cl.$^5$ ............................................. H03K 5/153
[52] U.S. Cl. ..................................... 307/354; 307/261; 328/164
[58] Field of Search ............... 307/351, 354, 358, 261, 307/542; 328/164, 150, 115, 116, 117, 13

[56] References Cited

U.S. PATENT DOCUMENTS

| | | | |
|---|---|---|---|
| 4,069,452 | 1/1978 | Conway et al. | 307/351 |
| 4,079,327 | 3/1978 | Van Uffelen | 328/117 |
| 4,297,676 | 10/1981 | Moriya et al. | 307/351 |
| 4,658,368 | 4/1987 | Blais | 307/351 |
| 4,766,332 | 8/1988 | Pelgrom et al. | 307/358 |
| 4,777,629 | 10/1988 | Morris et al. | 307/351 |
| 4,916,673 | 4/1990 | Morris et al. | 307/351 |

Primary Examiner—Stanley D. Miller
Assistant Examiner—Toan Tran
Attorney, Agent, or Firm—Bernard Franzblau

[57] ABSTRACT

An adaptive arrangement for the identification of a periodic input signal ($U_S$), for example, a signal supplied by magnetic field speed sensors. An evaluation circuit (11) is provided for digitizing the signal ($U_S$) and for detecting the extreme values thereof, an interference-free output signal being present at the output of the evaluation circuit (11) in the event of small interferences which are less than a presettable minimum turn-over voltage ($U_M$). In the event of larger interferences, subsequent means are provided for detecting the fundamental oscillation of the signal ($U_S$). The subsequent means (12, 13) include a mean value producing circuit (12) and a comparator (13). The comparator compares the digitized signal ($U_{SD}$) with a reference value signal ($U_V$) which the mean value producing circuit (12) recursively forms from the extreme values of the signal ($U_S$). The comparator produces an interference-free output signal ($U_A$) which is proportional to the fundamental oscillation frequency of the periodic signal ($U_S$).

16 Claims, 1 Drawing Sheet

ADAPTIVE ARRANGEMENT FOR IDENTIFYING A PERIODIC SIGNAL

BACKGROUND OF THE INVENTION

This invention relates to an adaptive arrangement for the identification of a periodic signal comprising an evaluation circuit for digitizing the signal and for detecting its extreme value, as well as subsequent means for detecting the fundamental oscillation of the signal.

Arrangements of this type are used to identify periodic signals having an unkown frequency, amplitude and offset position, as well as dips in the amplitude in the region of its extreme value. These parameters of the signal to be identified, abbreviated to signal hereinafter, are furthermore also subjected to variations in time. Examples of signals of this type are signals from speed sensors which are used in, for example, anti-locking systems, anti-slip systems etc. Speed sensors of this type usually produce a relatively small, fluctuating sensor signal on which a d.c. voltage is superposed. Via a subsequent comparator this changing sensor signal, beset with fluctuations, is usually digitized, that is to say it is converted into a corresponding square-wave signal and applied to a further evaluation circuit.

Identification or measuring arrangements of this type are known. They usually have a gear wheel whose signal indicates the number of revolutions and is sampled via, for example, a magnetically operating speed sensor. The German Patent Application P 3926617.6, which corresponds to U.S. Application Ser. No. 562,526, filed Aug. 3, 1990, corresponding arrangement which comprises means for amplifying, comparing and evaluating the sensor signal of the speed sensor to produce a corresponding digital output signal. In accordance with said arrangement, the signal must be unambiguously identified and evaluated, for which purpose a window comparator having a controllable window is provided as a comparator means which, via at least one logic circuit member drives a flip-flop for the supply of the output signal and is followed by means which, in dependence on the offset position continuously produce corresponding reference signals for the window comparator. The comparator and evaluation devices of this prior art arrangement furthermore include an oscillator for adapting the window range to the signal to be identified. For the case in which the signal has a dip in the regions of its peak value, there is provided in accordance with this prior art arrangement an oscillator frequency which is not significantly greater than the frequency of the signal so that the window of the window comparator does not track the signal anymore, but tracks it with some delay, the degree of this delay being limited by the oscillator frequency. At low frequencies of the signal the signal is also tracked in the region of the dips so that, as regards dips in the signal to be identified in the region of its extreme values, this prior art arrangement is not entirely reliable.

SUMMARY OF THE INVENTION

The present invention has for an object to provide an adaptive arrangement for identifying a periodic signal, which also in the case of high offset voltage tolerances, shifts and dips produces an output signal which is proportional to the fundamental oscillation (i.e. frequency) of the signal and has a simple structure, and which also operates reliably in the event of other types of interferences.

According to the invention, this object is accomplished in that the subsequent means include a mean value producing circuit and a comparator, and that, depending on whether the digital signal corresponds to a reference value which the mean value producing circuit recursively forms from the extreme values of the digitized signal, the comparator produces a variable output signal which is proportional to the fundamental oscillation of the signal.

Basically, the arrangement of the invention includes an evaluation circuit, a mean value circuit and a comparator. The evaluation circuit includes an analog/digital converter which operates in accordance with the compensation mode and includes a counting device (abbreviated to A/D converter hereinafter), to whose input the signal to be identified is applied, and a subsequent extreme value identification member whose output is connected to the mean value circuit and applies a clock signal thereto in response to the fact that an extreme value is reached. The output of the A/D converter is connected to the mean value circuit and the comparator. The analog input of the A/D converter also is connected to the extreme value identification member, which determines the extreme value from a comparison between the analog input signal and the digital signal corresponding thereto.

If in the ideal case an interference-free, sinusoidal input signal is present at the input of the evaluation circuit, then this circuit first determines whether the signal has passed through an extreme value, that is to say whether it has passed through a maximum or a minimum. These points are determined with the aid of the A/D converter in the compensation mode in that the counting direction of the converter counting device reverses after an extreme value. Advantageously, the detection of an extreme value in the evaluation circuit is not effected until a presettable minimum turn-over voltage has been reached after an extreme value.

Because of this delay small interferences in the input signal are already compensated. The value of the minimum turn-over voltage consequently also determines the lowest detectable input amplitude. The output signal can then be derived from the direction in which the converter counting device counts.

Any occurring harmonics, more specifically for signals from a magnetic field sensor the third harmonic oscillation, are frequently located within the circuit sensitivity. The effects of these harmonics, namely dips in the region of the extreme (peak) values of the signal, are identified as errors in accordance with the invention and are suppressed. The subsequent mean value circuit advantageously comprises a series arrangement of an adder member, a divider member and a storage member, the output signal of the storage member being applied as a reference value to the comparator and fed back to the input of the adder member, the adder member further having its input connected to the output of the A/D converter. Preferably, the storage member receives clock pulses from the output of the extreme value identification member.

In accordance with an advantageous embodiment of the invention, the adder member continuously produces the sum of its input signals. The subsequent divider member divides the sum by two and the storage member which follows the divider member stores at the instant a clock signal occurs the signal value then present and passes it on from its output to the input of the comparator as a reference value, and also via its input to the adder member.

All of the extreme values, consequently also the extreme values of the harmonics, are therefore applied to a recursive mean value producing circuit, that is to say at the instant an extreme value is detected, the actual digital signal value of the A/D converter is as it were added to the input of the storage member. The result of the addition then arrives, after it has been divided by two, as a new signal value in the storage member and represents the latest signal mean value following after the measuring signal, so the reference value.

In accordance with the invention, the comparator is connected at its input end to the output of the A/D converter and to the storage member of the mean value circuit and, at the instant the signals applied thereto are identified, produces a digital output signal which is proportional to the fundamental oscillation of the signal to be identified.

In addition, it is advantageous to provide a charging circuit which loads the available signal value in the storage member when the arrangement is put into use. Otherwise, for example when a zero value has been stored in the storage member, the reference value will need some periods to approach the signal.

For certain signals to be identified, in which the harmonic oscillations are not within the circuit sensitivity, a simplified, adaptive arrangement for identifying a periodic signal, including an evaluation circuit for digitizing the signal and for detecting the extreme values of this signal, can be provided in accordance with the invention, in which advantageously the evaluation circuit includes an A/D converter to the input of which the signal to be identified is applied, and a subsequent extreme value identification member, which when a presettable minimum turn-over voltage is reached after a detected extreme value, produces a variable output signal which is proportional to the fundamental oscillation of the signal.

Further preferred embodiments of the arrangement in accordance with the invention are defined in the dependent claims.

BRIEF DESCRIPTION OF THE DRAWING

An embodiment of the invention will now be described by way of example with reference to the accompanying drawing, in which.

DESCRIPTION OF THE PREFERRED EMBODIMENTS

Figure 1:
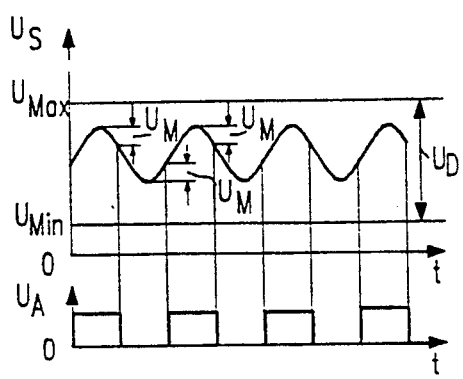
FIG. 1 shows an output signal $U_A$ of an arrangement in accordance with the invention on the basis of a non-distorted signal $U_S$ taking account of a minimum turn-over voltage $U_M$.
Figure 3:
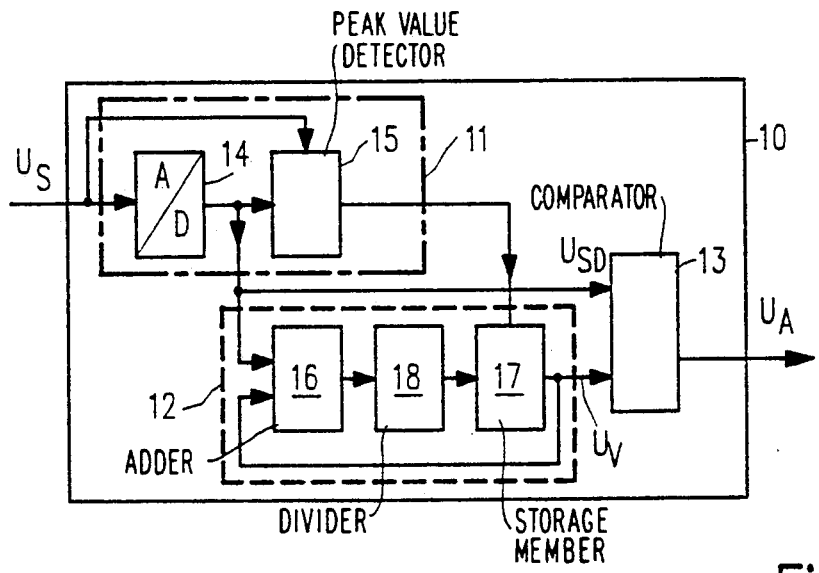
FIG. 3 is a block circuit diagram of an arrangement according to the invention including a mean value circuit.

FIG. 1 shows two diagrams. The upper diagram shows the signal $U_S$ to be identified over the period of time t and the lower diagram shows a digital output voltage $U_A$ on the basis of an ideal sinusoidal undisturbed signal $U_S$. The signal $U_S$ to be identified is shifted upwards from the zero position. Throughout the permissible operating range $U_D$ of an arrangement 10 of the invention, whose basic circuit diagram is shown in FIG. 3, this shift is indicated by means of a lower permissible signal $U_{Min}$ and an upper permissible signal $U_{Max}$. The signal $U_S$ to be identified, shown in FIG. 1, is, for example, the signal at the output of a magnetically operating speed sensor of an anti-blocking or anti-slip system or such provided at the input side of the arrangement of the invention. As is shown in FIG. 1 and is explained in detail hereinafter, the pulses for producing the output signal $U_A$ are not set accurately on reaching the extreme value of the signal $U_S$, but follow these extreme values with some time delay. This delay can be influenced by means of a presettable minimum turn-over voltage $U_M$. Disturbances in the signal $U_S$ which, as regards their value, are within the minimum turn-over voltage $U_M$ can already be compensated for thereby. Simultaneously, the minimum turn-over voltage $U_M$ determines the lowest detectable amplitude of the signal $U_S$ to be identified, which consequently limits its magnitude, that is to say the minimum turn-over voltage $U_M$ has a value less than the value of twice the amplitude of the minimum detectable signal $U_S$. In other words, the voltage $U_M$ must be smaller than the peak-to-peak value of the signal $U_S$ in order to make it possible to make a distinction between a signal and a disturbance.

Figure 2:
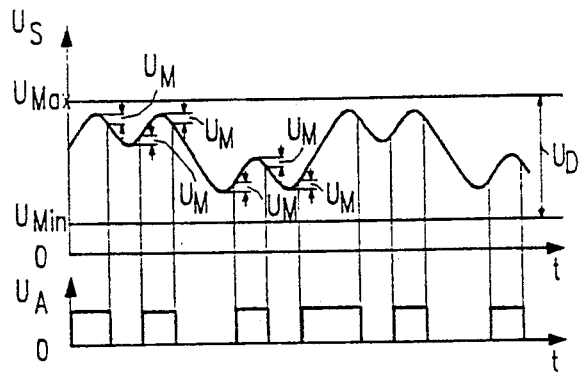
FIG. 2 shows a faulty output signal $U_A$ of an arrangement according to the invention without a mean value circuit in the case of signal harmonic oscillations within the circuit sensitivity.
Figure 4:
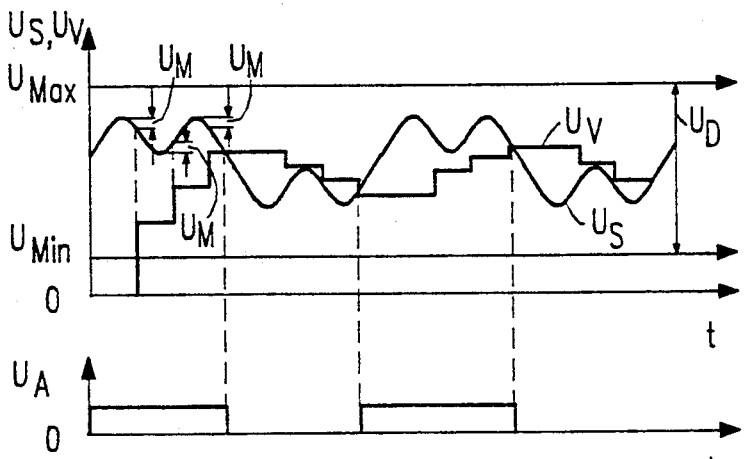
FIG. 4 shows an output signal $U_A$ of an arrangement according to the invention including a mean value circuit in the case of signal harmonic oscillations within the circuit sensitivity.

It should here be noted that the description given in the foregoing with reference to FIG. 1 of the diagrams as regards the magnitudes shown there also holds, in essence, for the diagrams shown in FIGS. 2 and 4. In addition, it should be noted that the signals $U_S$ to be identified and shown in the FIGS. 1, 2 and 4 represent both analog and the approximately digital variation of these signals.

FIG. 2 shows a disturbed variation of the signal $U_S$, in which the harmonic oscillations of the signal $U_S$ cause dips therein in the region of its extreme values. A magnetic field sensor of a speed sensor also produces, for example, in the case of poorly functioning sensor wheels also, the third harmonic oscillation in addition to the fundamental oscillation. The third harmonic oscillation is within the sensitivity of the arrangement, that is to say the dips caused thereby have a value higher than the minimum turn-over voltage $U_M$ and consequently produce a faulty output signal $U_A$, as is shown in the lower diagram of FIG. 2.

In order to unambiguously prevent interferences caused by harmonic oscillations, the arrangement 10 of the invention, shown in FIG. 3, comprises an evaluation circuit 11, a mean value circuit 12, and also a comparator 13 at whose output a variable output signal $U_A$ is present and which is now only proportional to the fundamental oscillation of the signal $U_S$. The analog signal $U_S$ is applied for that purpose to an A/D converter 14 of the evaluation circuit 11 and is digitized thereby and this digitized signal $U_{SD}$ is transferred to an extreme value identification member 15 of the evaluation circuit 11, to the comparator 13 and to the input of an adder member 16 of the mean value circuit 12. The analog signal $U_S$ is further coupled to the extreme value identification member 15 via a control terminal. The analog signals $U_S$ is effectively compared in the apparatus 15 with the digitized signal $U_{SD}$ at the output of the compensation-type converter 14. If the difference of these signal voltages exceeds $U_M$, a change of state occurs at the output of the peak value identification member 15 when the polarity of the difference changes. Thus, in the evaluation circuit 11 the digitized signal $U_{SD}$ is analysed to detect whether it has passed through a maximum or a minimum. These points are determined with the aid of the A/D converter 14 in accordance with the compensation method in that the counting direction of the counter in the A/D converter 14 changes direction after it has passed through an extreme value. As has already been mentioned in the foregoing, small interferences in the signal are compensated as the arrangement responds only to a minimum turn-over voltage $U_M$ after a minimum or a maximum has been passed.

In a manner similar to that described in the aforesaid German Patent Application P 3926617.6, the compensation-type A/D converter 14 may comprise a hysteresis comparator having one input for receiving the analog signal $U_S$. The output of the comparator is connected to an input of an up/down counter having a clock input coupled to an output of an oscillator. The digital output of the counter is applied to a D/A converter whose analog output signal is coupled to a second input of the hysteresis comparator. The digital output signal ($U_{SD}$) of the counter is applied to a D/A converter in the member 15. The analog output of the latter D/A converter is compared in a comparator in member 15 with the analog signal $U_S$ applied to the input of the A/D converter 14. The output of the latter comparator is a control signal output of member 15 destined for use in storage member 17.

The input analog signal $U_S$ is compared in the hysteresis comparator with the converter analog signal produced by the first mentioned D/A converter in response to the digital output of the up-down counter. If the converter signal is smaller than the analog input signal $U_S$, the counter counts up. When the counter reaches a value that corresponds to the analog input signal ($U_S$), it stops counting. The control loop is then in equilibrium. If the input signal $U_S$ increases further, the counter follows this signal and counts up. Consequently, there is no change in the counting direction. Only after the input signal $U_S$ decreases and drops below the equivalent count in the counter, the counter starts counting down and thus reverses its counting direction. The hysteresis $U_M$ built into the comparator prevents a disturbance signal below $U_M$ from causing a change in the counting direction. Therefore, a change in the counting direction occurs only when the two analog signals differ by more than $U_M$ and the sign changes simultaneously.

For the case in which the dips caused by an interference have a value less than the minimum turn-over voltage $U_M$, then, in accordance with a preferred embodiment of the invention, the signal already produced at the output of the extreme value identification member 15 can be further processed as an error-free output signal. If however, the interferences are larger than $U_M$ as shown in FIG. 2, then in accordance with the invention the control signal present at the output of the extreme value identification member 15 is applied as a clock signal or a charging pulse signal to a storage member 17 of the mean value circuit 12. The storage member 17 receives the signal values to be stored from a preceding divider member 18, which itself is arranged subsequently to the adder member 16, and applies the stored signal value to both the comparator 13 as a reference value $U_V$ and to the input of the adder member 16 via a feedback branch. Because of this combination within the mean value circuit 12 a recursive mean value formation can be effected. Then the digitized signal $U_{SD}$ is available at the input of the adder member 16 as a signal value, as is also the signal value of the storage member 17 corresponding to the preceding charging pulse, that is to say corresponding to the last extreme value. The adder member 16 continuously forms the sum from the signal values present at its input. This sum is divided by two in the subsequent divider member 18 so that this function is available approximately in real time at the input of the storage member. If now a new charging pulse is applied from the extreme value identification member 15 to the storage member 17, then the corresponding function value of the signal $U_{SD}$ is stored as a new signal value in the storage member 17 and applied to the input of both the comparator 13 and the adder member 16.

The comparator 13 employs this reference signal $U_V$ originating from the storage member 17 and compares it to the digitized signal $U_{SD}$, which is also made available to it as an input signal via the A/D converter 14. At each instant at which the input signals of the digital comparator 13 are in agreement, it produces a change in its output state, in response to which the output signal $U_A$ of the arrangement in accordance with the invention is formed.

Referring to FIG. 4, the comparator 13 determines the points of intersection of the digital signal $U_{SD}$ and the staircase reference signal $U_V$ trailing this signal $U_{SD}$, as it is available at the output of the mean value circuit 12. As is shown in FIG. 4, the points of intersection of these two curves are proportional to the fundamental oscillation of the signal $U_S$, without interfering harmonic oscillations having any influence on the output signal $U_A$.

As has already been mentioned in the foregoing, FIG. 4 shows in a simplified manner the variation of the analog signal $U_S$, although actually the signal $U_{SD}$ digitized by the A/D converter 14 is involved. If, for example, the storage member 17 contains the value zero at the beginning of an identification, then, as is shown above the staircase reference signal $U_V$ in FIG. 4, this may result, for small signals $U_S$ with a large offset, in the suppression of some starting periods as the content of the storage member 17 must first approach the input signal $U_S$. By means of a charging circuit, not shown, it is possible to load, in accordance with the invention, the store of the storage member 17 with the instantaneous digitized signal $U_{SD}$, on making the arrangement operative, which enables a fast start of the arrangement according to the invention.

It should here be noted that all of the mentioned signal values and signal magnitudes, respectively, are advantageously electric voltages. The characterizing features of the invention disclosed in the preceding description, in FIGS. 1, 2, 3 and 4 and also in the claims, may be essential for realising the invention in its different embodiments, both individually and in any combination.

I claim:

1. An adaptive arrangement for identification of a periodic signal comprising:
   an evaluation circuit for digitizing the periodic signal and for detecting its extreme values, said evaluation circuit including input means for receipt of the periodic signal and output means, means for detecting a fundamental frequency of the periodic signal, said detecting means comprising input means coupled to the output means of the evaluation circuit and a mean value producing circuit coupled in cascade with a comparator, wherein said mean value producing circuit recursively derives a reference value signal from the extreme values of the digitized signal as a function of a comparison of the digitized signal with the reference value signal, and wherein said comparator compares said reference value signal and the digitized signal to produce at its output, as a function of correspondence of said signals, a variable output signal whose frequency is proportional to the fundamental frequency of the periodic signal.

2. An arrangement as claimed in claim 1 wherein the evaluation circuit includes an analog/digital converter having an input coupled to said input means of said evaluation circuit so as to receive the periodic signal to be identified and, coupled in cascade with the analog/digital converter, an extreme value identification member having an output connected to the mean value producing circuit to which it applies a control signal dependent on whether an extreme value of the periodic signal is reached. and means connecting an output of the A/D converter to the mean value producing circuit and to the comparator.

3. An arrangement as claimed in claim 2, wherein the evaluation circuit detects the extreme values of the periodic signal in accordance with a compensation method in which the direction of count of a counter device of the A/D converter reverses after an extreme value and the control signal of the extreme value identification member changes its state as a function of the count direction of the counter of the A/D converter and of a presettable minimum turn-over voltage ($U_M$).

4. An arrangement as claimed in claim 3, wherein the minimum turn-over voltage ($U_M$) is less than twice the amplitude of the periodic signal to be identified, and the extreme value identification member does not change its output state until a change in signal value corresponds to the minimum turn-over voltage ($U_M$) occurring after an extreme value of the periodic signal.

5. An arrangement as claimed in claim 2 wherein the mean value producing circuit comprises a series arrangement of an adder member, a divider member and a storage member, an output signal of the storage member being applied as the reference value signal ($U_V$) to the comparator and being fed back to an input of the adder member, and wherein said connecting means connects the output of the A/D converter (14) to the input of the adder member, and wherein the output of the extreme value identification member is connected to the storage member to supply thereto said control signal.

6. An arrangement as claimed in claim 5, wherein the adder member continuously forms a sum value of its input signals, the divider member divides said sum value by two and at an instant at which a control signal occurs the storage member stores the signal value then present and makes it available at its output as the reference value signal ($U_V$).

7. An adaptive arrangement for identifying a periodic signal ($U_S$) comprising: an evaluation circuit for digitizing the periodic signal and for detecting its extreme values, characterized in that the evaluation circuit comprises an A/D converter, at whose input the periodic signal ($U_S$) to be identified is present, and an extreme value identification member coupled to an output and an input of the A/D converter, which periodic signal, on reaching a presettable minimum turn-over voltage ($U_M$) after a detected extreme value produces a variable output signal ($U_A$) which is proportional to a fundamental oscillation frequency of the periodic signal.

8. An arrangement as claimed in claim 7, wherein the evaluation circuit first detects the extreme values in accordance with a compensation method in that the counting direction of a counting device of the A/D converter reverses after an extreme value, and wherein the extreme value identification member does not change its output state until after occurence of an extreme value of the periodic signal ($U_S$) and a change in signal value corresponds to a presettable minimum turn-over voltage.

9. An arrangement as claimed in claim 8, wherein the minimum turn-over voltage ($U_M$) is less than twice the amplitude of the periodic signal and is chosen greater than a largest anticipated indentation of a disturbance in the region of the extreme values of the periodic signal.

10. An arrangement as claimed in claim 3 wherein the mean value producing circuit comprises a series arrangement of an adder member, a divider member and a storage member, an output signal of the storage member being applied as the reference value signal ($U_V$) to the comparator and being fed back to an input of the adder member, and wherein said connecting means connects the output of the A/D converter to the input of the adder member, and wherein the output of the extreme value identification member is connected to the storage member to supply thereto said control signal.

11. An arrangement as claimed in claim 10, wherein the adder member continuously forms a sum value of its input signals, the divider member divides said sum value by two and at an instant at which a control signal occurs the storage member stores the signal value then present and makes it available at its output as the reference value signal ($U_V$).

12. An adaptive apparatus for digitizing a periodic analog signal subject to harmonic distortion comprising:
an input for receiving the periodic analog signal,
a compensation type analog/digital (A/D) converter having its input coupled to the apparatus input,
a peak value detector having a first input coupled to an output of the A/D converter, a second input coupled to said apparatus input, and an output for producing a control signal,
a mean value circuit having first and second inputs coupled to the output of the A/D converter and to said output of the peak value detector, respectively, and
a comparator having first and second inputs coupled to said output of the A/D converter and to an output of the mean value circuit, respectively, and having an output which produces a digital signal with a frequency proportional to a fundamental frequency of said periodic analog signal.

13. An apparatus as claimed in claim 12 wherein the peak value detector is governed so that said control signal changes its state after the occurrence of a peak value of the periodic analog signal and with a time delay determined at least in part by a minimum turn-over voltage ($U_M$).

14. An apparatus as claimed in claim 12 wherein said mean value circuit further comprises:

a signal combining circuit coupled in cascade with a storage device wherein first and second inputs of the signal combining circuit are coupled to said first input of the mean value circuit and to an output of the storage device, respectively, whereby the mean value circuit recursively forms a reference value signal ($U_V$) at said storage device output, a control input of the storage device being coupled to the second input of the mean value circuit so as to receive said control signal, and wherein the storage device output is coupled to the output of the mean value circuit thereby to supply the reference value signal to the second input of the comparator.

15. An apparatus as claimed in claim 14 wherein said signal combining circuit comprises an adder and said apparatus further comprises a divider coupled in cascade with and between the adder and the storage device.

16. An apparatus as claimed in claim 11 wherein said periodic analog signal comprises an approximately sinusoidal signal received from a speed sensor device.

* * * * *

UNITED STATES PATENT AND TRADEMARK OFFICE
CERTIFICATE OF CORRECTION

PATENT NO. : 5,118,967
DATED : June 2, 1992
INVENTOR(S) : MATHIAS MUTH

It is certified that error appears in the above-identified patent and that said Letters Patent is hereby corrected as shown below:

Column 4, line 44, delete "also".

COLUMN 10:
Claim 16, line 1, change "11" to --1--.

Signed and Sealed this

Eleventh Day of January, 1994

Attest:

BRUCE LEHMAN

*Attesting Officer*  *Commissioner of Patents and Trademarks*